United States Patent
Dulman et al.

(10) Patent No.: US 6,737,200 B2
(45) Date of Patent: May 18, 2004

(54) METHOD FOR ALIGNING A CONTACT OR A LINE TO ADJACENT PHASE-SHIFTER ON A MASK

(75) Inventors: H. Daniel Dulman, Boise, ID (US); William A. Stanton, Boise, ID (US)

(73) Assignee: Micron Technology, Inc., Boise, ID (US)

(*) Notice: Subject to any disclaimer, the term of this patent is extended or adjusted under 35 U.S.C. 154(b) by 131 days.

(21) Appl. No.: 09/770,385

(22) Filed: Jan. 29, 2001

(65) Prior Publication Data
US 2002/0102469 A1 Aug. 1, 2002

(51) Int. Cl.[7] .............. G03F 9/00; G03F 5/00; G03C 5/00
(52) U.S. Cl. .............. 430/5; 430/330; 430/394
(58) Field of Search .............. 430/5, 296, 330, 430/394, 322, 323, 324

(56) References Cited

U.S. PATENT DOCUMENTS

| | | |
|---|---|---|
| 5,484,672 A | 1/1996 | Bajuk et al. |
| 5,532,089 A | 7/1996 | Adair et al. |
| 5,633,103 A | 5/1997 | DeMarco et al. |
| 5,747,196 A | 5/1998 | Chao et al. |
| 5,789,116 A * | 8/1998 | Kim .............. 430/5 |
| 5,955,222 A * | 9/1999 | Hibbs et al. .............. 430/5 |

OTHER PUBLICATIONS

AZ5200 Positive Photoresist (Aug. 24, 2000).

* cited by examiner

*Primary Examiner*—Mark F. Huff
*Assistant Examiner*—Saleha R. Mohamedulla
(74) *Attorney, Agent, or Firm*—Dickstein Shapiro Morin & Oshinsky LLP

(57) ABSTRACT

A method for fabricating a mask which includes a printable contact and/or line area which is aligned with a phase-shifter. The method includes preparing a mask-in-process comprising a substrate underlying a first layer, an opaque layer overlying the first layer, and a first resist material overlying the opaque layer, and subjecting the mask-in-process to a plurality of exposures and at least one etching to create a phase-shifter and to open a printable contact and/or line area surrounded by a second resist material, wherein the printable contact and/or line area is aligned with the phase-shifter.

31 Claims, 10 Drawing Sheets

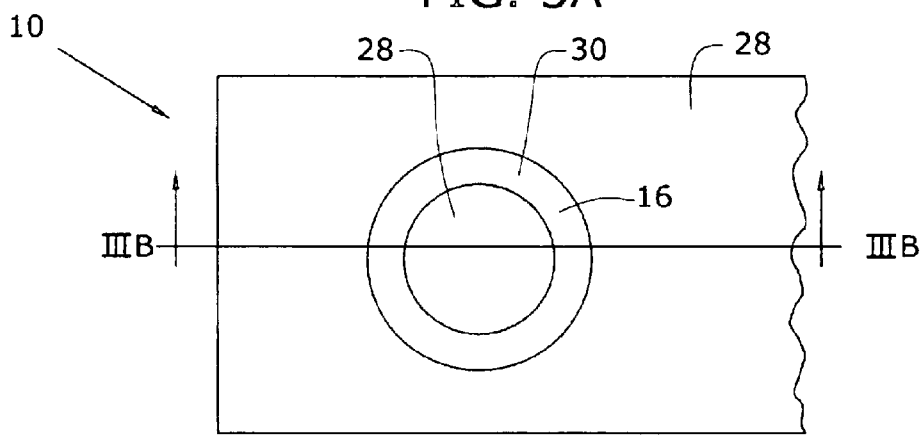
FIG. 3A
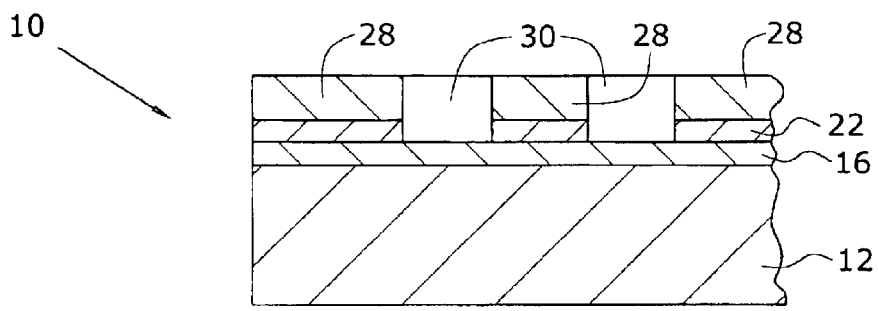
FIG. 3B
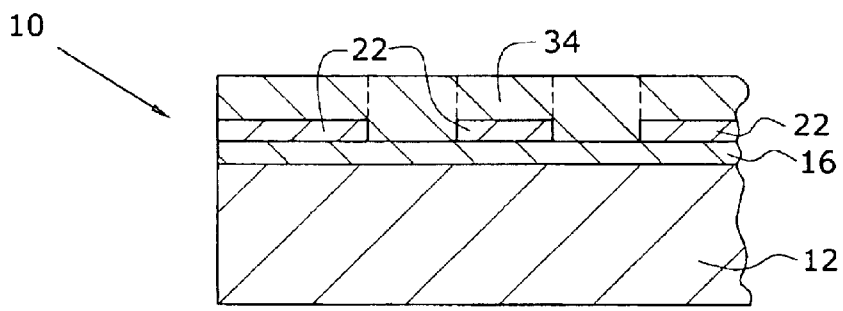
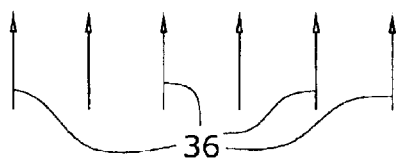
FIG. 4

FIG. 9
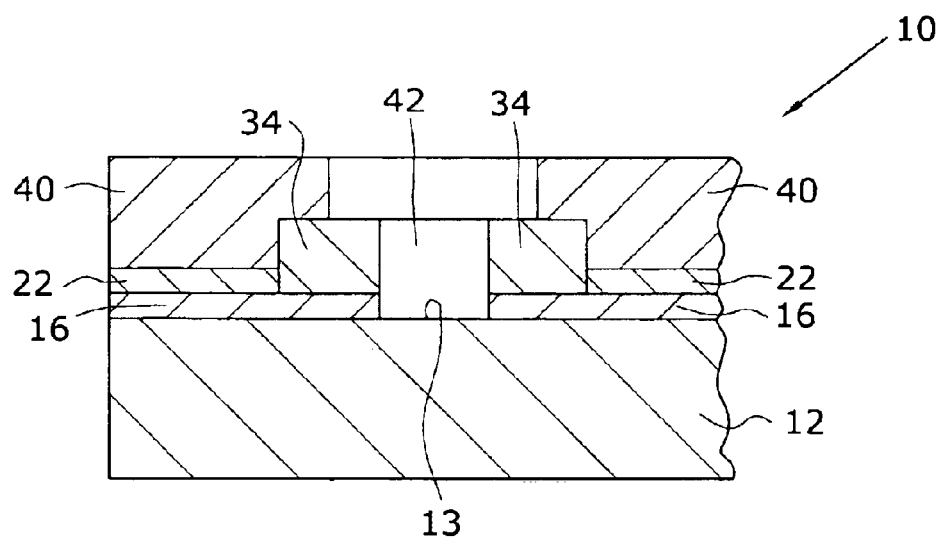
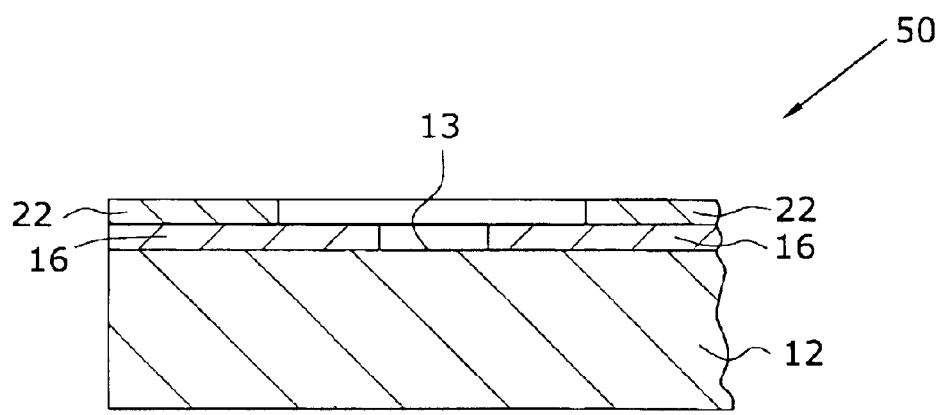
FIG. 10

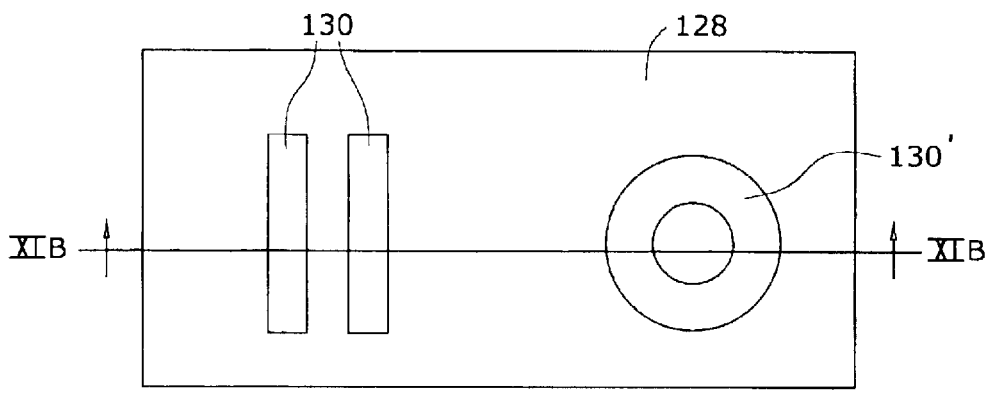
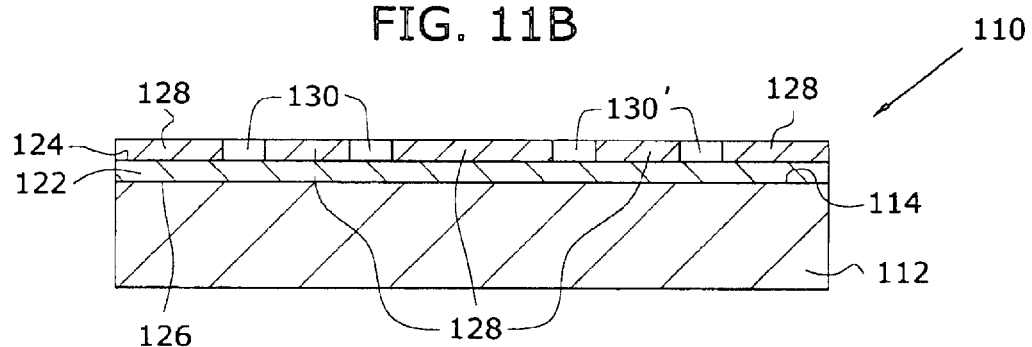
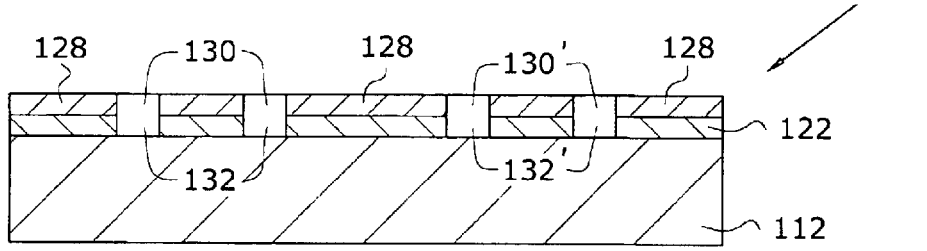

METHOD FOR ALIGNING A CONTACT OR
A LINE TO ADJACENT PHASE-SHIFTER ON
A MASK

FIELD OF THE INVENTION

The present invention relates generally to optical lithography used for fabricating semiconductor devices, and more particularly to optical lithographic phase-shifting masks and a method for fabricating such masks.

BACKGROUND

Photolithography methods are well-known for producing fine patterns on integrated circuits and other electronic devices. Typically, photosensitive resist material is deposited upon a substrate and a portion of the material is exposed in a predetermined pattern. The pattern is then developed by selective removal or retention, depending upon whether the resist material is a positive or a negative resist.

Exposure of the resist material is typically accomplished by transmitting light, e.g. ultraviolet light, through a mask. Exposure through a mask causes diffraction, image spreading, and/or other interference effects at the boundaries of opaque areas of the masks. Such effects may cause ghost patterns or lobes in the exposed pattern. This is partly because the masks must be at a distance from the resist material during exposure in order to ensure that the size of the pattern at the resist surface is reduced compared to the size of the pattern in the mask. Until fairly recently, these effects were relatively dimensionally small. However, recent increases in the integration density of integrated circuits has pushed minimum feature sizes of patterns such that the effects are now becoming significant.

To improve the clarity of the exposure patterns, phase-shifting masks have been developed to limit the image spreading effects. One type of phase-shifting mask, a rim type phase-shifting mask, assists in limiting image spreading in the exposure of features having a closed shape, such as contacts. Another type is a Levenson-type phase-shifting mask, which assists in limiting image spreading in the exposure of periodically repeated patterns, like parallel lines, such as arrays of parallel conductors.

The fabrication of phase-shifting masks generally has been difficult and expensive due to the need to form extremely small regions having differing optical lengths at the edges of opaque regions. Thus, either patterning must be done within the mask pattern or the opaque regions of the mask must be recessed from the regions of differing optical path length. Examples of known phase-shifting mask fabrication methods can be found in U.S. Pat. No. 5,747,196 (Chao et al.), U.S. Pat. No. 5,633,103 (DeMarco et al.), U.S. Pat. No. 5,532,089 (Adair et al.), and U.S. Pat. No. 5,484,672 (Bajuk et al.). Known phase-shifting mask fabrication methods have had difficulty with ensuring a symmetric exposure of either a printable contact area on the mask or a printable line area on the mask without image spreading effects.

SUMMARY

The invention provides a fabrication process for a phase-shifting mask which ensures that a printable contact area or a printable line area is exposed symmetric to an adjacent phase shifting feature.

In one aspect, the invention provides a method of forming a mask. The method includes forming a first layer of material over a substrate and forming an opaque layer overlying the first layer of material. The opaque material layer has at least one opening filled with a second material, the second material residing over the first layer of material and defining areas of the first layer of material which are to be removed. The method also includes using the second material as a mask to remove the areas of the first layer of material, and then removing the second material. The result is a phase-shifting mask which ensures that a printable contact area or a printable line area is exposed aligned to an adjacent phase shifting feature.

In another aspect, the invention provides a method of forming a mask, which includes forming an opaque layer over a substrate, the opaque layer having at least one opening therein filled with a first material, the first material defining areas of the substrate which are to be removed. The method also includes using the first material as a mask to remove the areas of the substrate, and removing the first material. The result is a phase-shifting mask which ensures that a printable contact area or a printable line area is exposed aligned to an adjacent phase shifting feature.

These and other advantages and features of the invention will be more readily understood from the following detailed description which is provided in connection with the accompanying drawings.

BRIEF DESCRIPTION OF THE DRAWINGS

FIG. 3A is a top view like FIG. 1 showing an opening in a first resist layer.

FIG. 3B is a cross-sectional view of the mask-in-process of FIG. 3A taken along line IIIB—IIIB.

FIGS. 4–5 are cross-section views, like FIG. 3B, showing subsequent processing steps to the mask-in-process of FIG. 1.

FIGS. 7–9 are cross-section views, like FIG. 6B, showing subsequent processing steps to the mask-in-process of FIG. 1.

FIG. 10 is a cross-sectional view of a mask constructed in accordance with the process steps of FIGS. 1–9.

FIG. 11A is a top view of a mask-in-process in accordance with an embodiment of the invention.

FIG. 11B is a cross-sectional view of the mask-in-process of FIG. 11A taken along line XIB—XIB.

FIGS. 12–19 are cross-sectional views, like FIG. 10, showing subsequent processing steps to a mask-in-process in accordance with another embodiment of the invention.

DETAILED DESCRIPTION OF PREFERRED EMBODIMENTS

Figure 1:
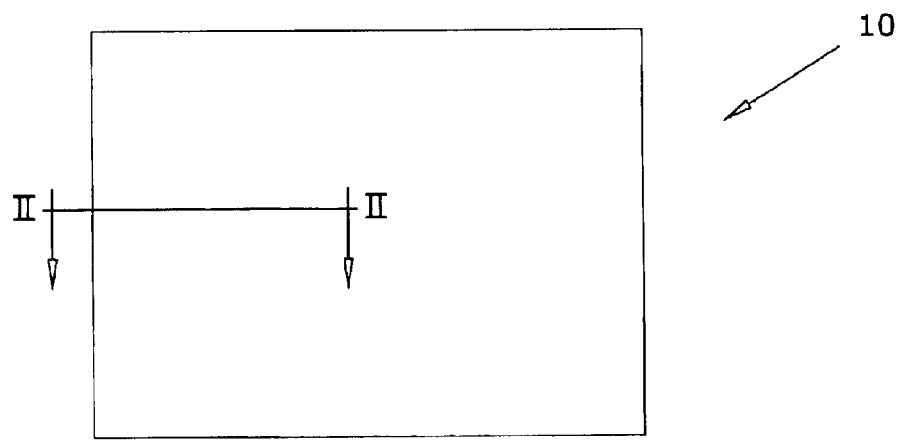
FIG. 1 is a top view of a mask-in-process in accordance with an embodiment of the invention.

The invention is directed to a mask fabrication process which may be used to ensure that printable contact areas and/or printable line areas will be laid symmetrical relative to an adjacent phase-shifter. A ring-like opening is exposed in a mask-in-process which leaves the printable contact area fully covered by an opaque layer. A resist is applied on a top surface and filling in the ring-like opening. The mask-in-process is exposed to ultraviolet light through a lower transparent material which leaves the resist only within the ring-like opening. Another resist is applied on an upper surface and covering the ring-like opening. Selective etching opens up the printable contact areas and/or printable line areas.

Through this process, openings can be exposed which are larger than the desired final printable contact areas. Thus, possible misalignments can be accounted for during the processing. Further, asymmetric rims can be laid and rims with different rim widths can be laid in different locations.

FIGS. 1–10 illustrate the processing of a mask 50 (FIG. 10) from a mask-in-process 10 in accordance with an aspect of the invention. The mask 50 will include a phase-shifter feature, which may be a rim type phase-shifter, once fabricated. The process described with reference to FIGS. 1–10 allows for printable contact areas or printable line areas to be opened up symmetrical to the adjacent phase-shifter feature.

The mask-in-process 10 includes a substrate 12, a layer 16, an opaque layer 22, and a first resist layer 28. The substrate 12 is formed of a transparent material, preferably quartz. A portion of the substrate 12 may eventually become either a printable contact area or a printable line area. A portion of the layer 16 adjacent to the printable contact area of the substrate 12 will eventually be fabricated into the phase-shifter. The layer 16 is preferably formed of a material or materials which allow for a one-hundred and eighty degree (180°) phase shift with respect to the open areas of the substrate 12. The material or materials may be formed of molybdenum-silicide, chromium flouride, silicon nitride-titanium nitride, tantalum silicide, zirconium silicon oxide or other like material. The opaque layer 22 may be formed of chromium or other material suitable for blocking out ultraviolet light.

The first resist layer 28 is positioned on a first surface 24 of the opaque layer 22. The opaque layer 22 is itself positioned on the layer 16 such that a second surface 26 of the opaque layer 22 is in contact with a first surface 18 of the layer 16. The layer 16 is positioned on the substrate 12 such that a second surface 20 of the layer 16 is in contact with a first surface 14 of the substrate 12.

Figure 2:
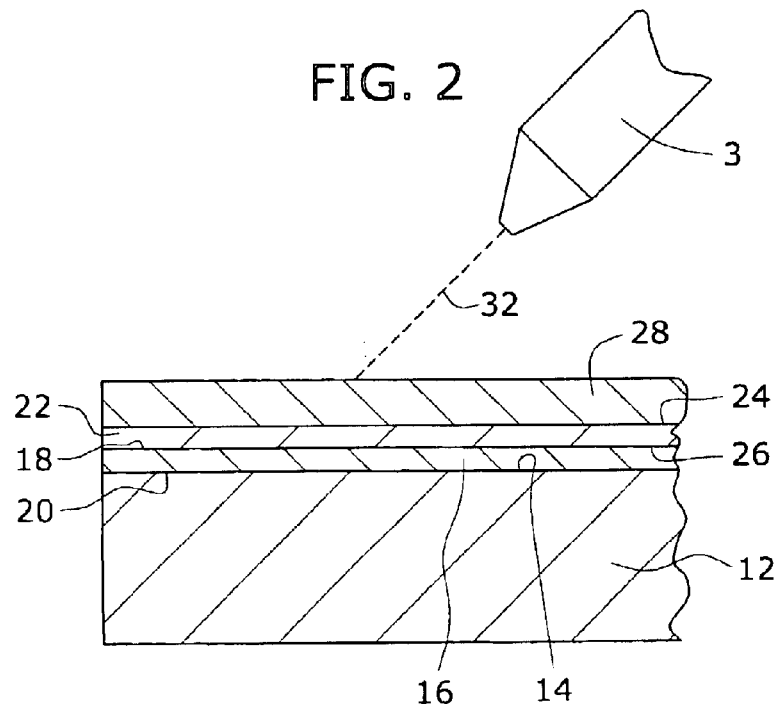
FIG. 2 is a cross-sectional view of the mask-in-process of FIG. 1 taken along line II—II.

As shown in FIG. 2, a first exposure 32 is directed toward portions of the first resist layer 28. A preferred exposure method utilizes an electron or laser beam 32 from, respectively, an electron beam or laser writing tool 3, such as, for example, MEBES 4500 or ALTA 3500. The exposed portions of the first resist layer 28 are removed, and the underlying portions of the opaque layer 22 are then etched (FIG. 3). The resist removal and opaque layer etching steps leave openings 30 within the mask-in-process 10. If, as shown in FIGS. 1–10, a rim type phase-shifter is being fabricated on the mask 50, the openings 30 are a single ring-shaped opening (FIGS. 3A–3B). The remaining first resist layer 28 is then removed. However, it should be understood that this technique is not limited by feature geometry.

The opening 30 is then filled with a second resist material 34 (FIG. 4), which covers the entire surface, including the exposed portions of the opaque layer 22. Preferably, the second resist material 34 is a positive-tone resist which can be made to image reverse to a negative-tone by way of a post-exposure bake process. One such resist material is AZ5200, supplied by Hoechst Celanese Corporation. Alternatively, any negative-tone resist compatible with a positive-tone resist could be used as the second resist material 34.

As shown in FIG. 4, a second ultraviolet exposure 36 is directed at the mask-in-process 10. Unlike the first exposure 32, the second is a flood exposure 36, directed through the substrate 12 toward the resist materials 28, 34. The opaque layer 22 serves as a mask to prevent exposure of some of the second resist material 34, and only the portion of the second resist material 34 within the ring-shaped opening 30 (shown within the opposing dotted lines in FIG. 4) is exposed by the second ultraviolet light 36. The mask-in-process 10 is then baked for a sufficient period of time to reverse tone and harden the exposed second resist material 34.

Figure 5:
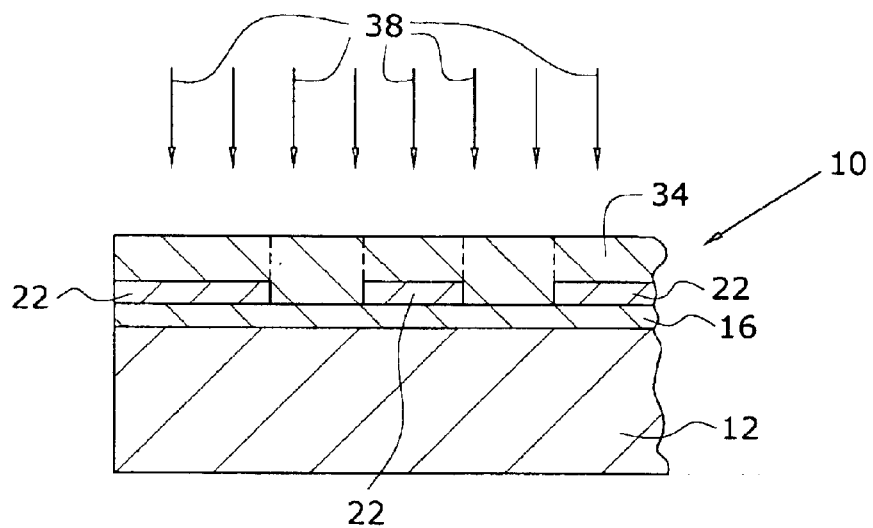
Figure 6A:
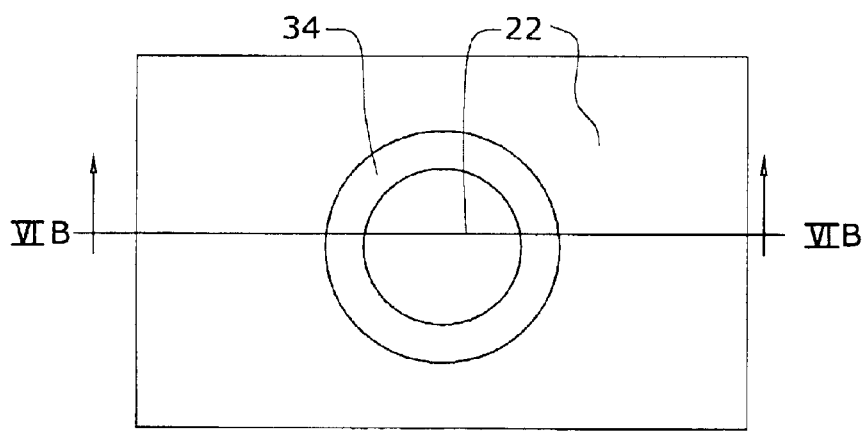
FIG. 6A is a top view like FIG. 1 showing a ring of resist material.
Figure 6B:
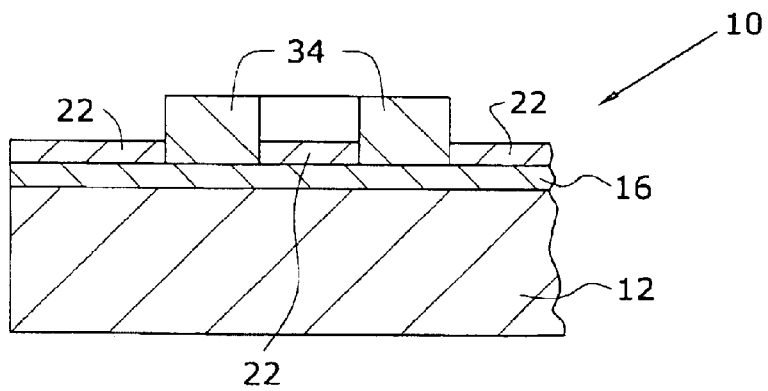
FIG. 6B is a cross-sectional view of the mask-in-process of FIG. 6A taken along line VIB—VIB.

FIG. 5 illustrates a third ultraviolet exposure 38 directed at the mask-in-process 10. The third exposure 38 is an ultraviolet flood exposure directed at the resist material 34. Since the second resist material 34 within the openings 30 has been reversed tone (to negative) and hardened, the third ultraviolet exposure 38 will only expose the remainder of the second resist material 34. As shown in FIGS. 6A and 6B, the portions of the second resist material 34 not within the openings 30 are rendered soluble in, e.g. tetramethyl ammonium hydroxide (TMAH), and then removed, leaving only a ring of the second resist material 34. Alternatively, the mask-in-process 10 may be subjected to a chemical bath to remove the previously unexposed portions of the second resist material 34.

Figure 7:
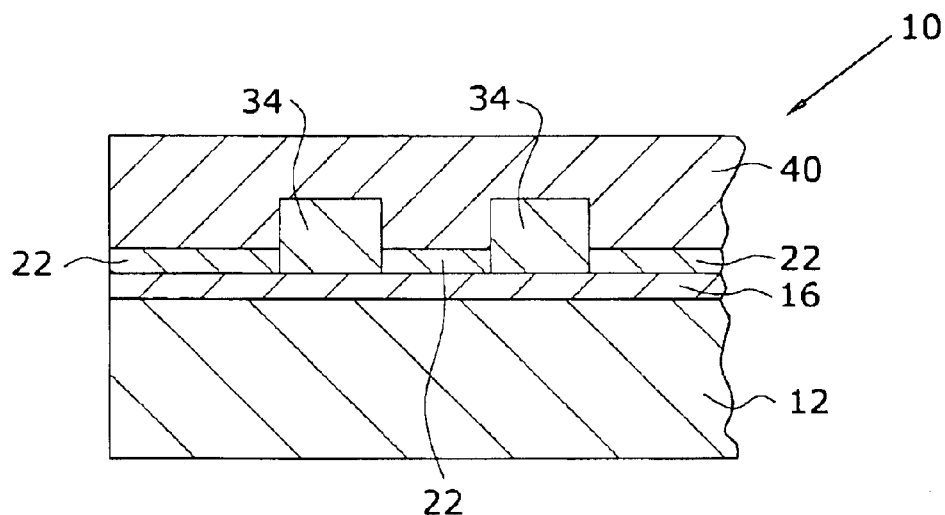
Figure 8:
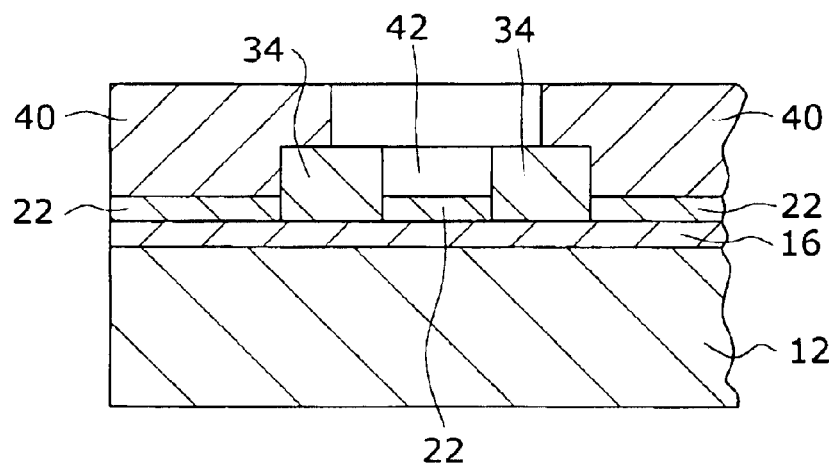
Figure 13:
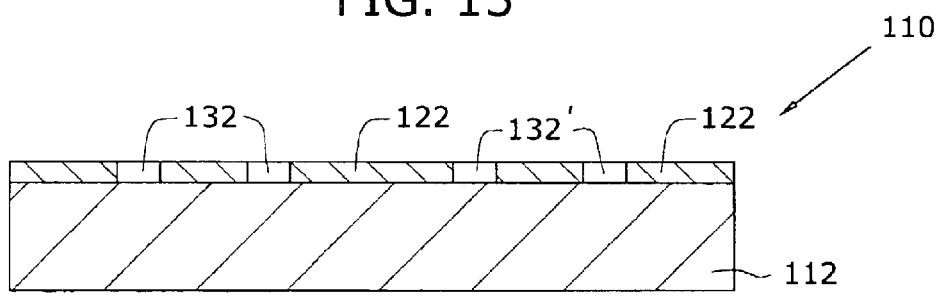

A third resist material 40 is overlaid over the opaque layer 22 and the ring of the second resist material 34 (FIG. 7). The third resist material 40 is preferably a positive-tone resist material. To initiate the opening of printable contact areas within the ring of the second resist material 34, the third resist material 40 is subjected to a lithography step, removing portions of the third resist material 40 to create an opening 42 bounded by the ring of the second resist material 34 (FIG. 8). The lithography step may be done with a larger than necessary opening 42, so misalignment is not a factor in the lithography step.

The opening 42 will eventually be extended down to the substrate 12 to become the printable contact area of the mask 50. Specifically, a portion of the opaque layer 22 and the layer 16 underlying the opening 42 is etched (FIG. 9) to open up a printable contact area 13. Once the printable contact area 13 is completely etched to the substrate 12, any remaining second and third resist materials 34, 40 are removed (FIG. 10) finishing the mask 50.

Through this process, a printable contact area 13 is opened interior to a ring of resist material, thereby ensuring alignment between the printable contact area 13 and the rim type phase-shifter formed by the portion of the layer 16 bounded by the printable contact area 13 and the opaque layer 22. It is to be understood that the above method is equally capable of creating a mask having printable line areas adjacent to and symmetrical with a Levenson-type phase-shifter. It is further to be understood that asymmetrical printable areas may be created through the above method. Finally, it is to be understood that the phase-shifters of the mask 50 may be zero degrees while the printable contact area 13 may be 180 degrees, or the phase-shifters may be 180 degrees while the printable contact area 13 may be zero degrees, or the phase-shifters and the printable contact area 13 may be somewhere in between zero and 180 degrees.

With reference to FIGS. 11–20, next will be described an alternative method for forming a mask 150 (FIG. 20) from a mask-in-process 110. The mask-in-process 110 includes a substrate 112 having a first surface 114, an opaque layer 122 having a first surface 124 and a second surface 126, and a resist layer 128. The opaque layer 122 is positioned relative to the substrate 112 such that the second surface 126 of the opaque layer 122 is in contact with the first surface 114 of the substrate 112. Further, the resist material 128 is positioned such that it contacts the first surface 124 of the opaque layer 122. Selective portions of the resist material 128 are exposed and subsequently removed, leaving generally parallel openings 130 and a generally ring-like opening 130' (FIG. 11A).

Figure 14:
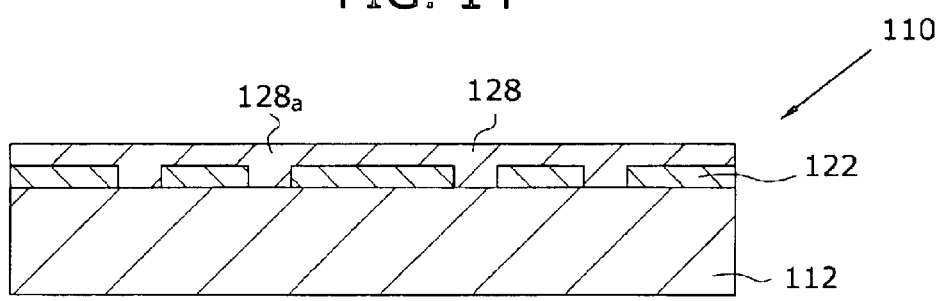
Figure 15:
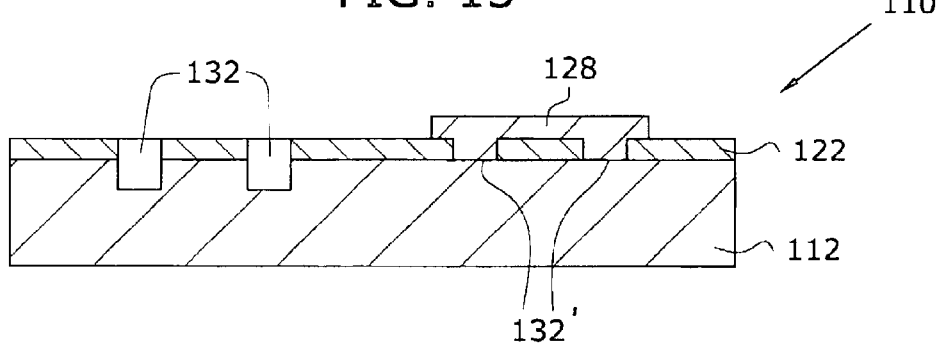

The mask-in-process 110 is then etched (FIG. 12). Specifically, portions of the opaque layer 122 underlying the openings 130 and the opening 130' are etched, thereby deepening the openings 130, 130' to opening extensions 132 and 132' which are each contiguous with, respectively, the first openings 130, 130'. Then, the first resist material 128 is completely removed (FIG. 13) and another layer of the first resist material 128 is deposited over the opaque layer 122 and the opening extensions 132 and 132' (FIG. 14). Then a portion 128a of the first resist material 128 overlying the opening extensions 132 is exposed. As shown in FIG. 15, an etching process is employed, which causes the opening extensions 132 to be further deepened into the substrate 112. A portion of the first resist material 128 is left to protect the opening extension 132' during the etching process.

Figure 16:
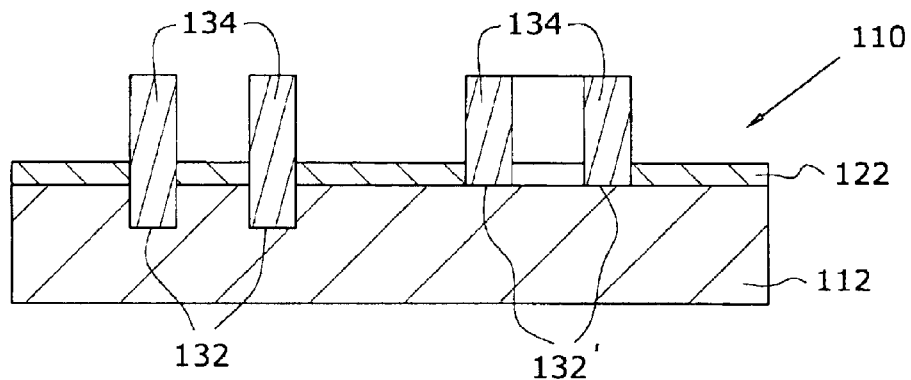

The remainder of the first resist material 128 is removed from the mask-in-process 110. After removal of the remaining first resist material 128, a second resist material 134 is deposited over the opaque layer 122 and within the opening extensions 132, 132'. The second resist material is similar to the resist material 34 of FIGS. 4–9, in that preferably the second resist material 134 is a positive-tone resist which can be made to image reverse tone as a negative-tone would by way of a post-exposure bake process. By exposing the second resist material 134 through the substrate 112, baking the mask-in-process 110, and then exposing the second resist material 134 a second time (the second time not being through the substrate 112), portions of the second resist material 134 can be removed to leave a pair of walls of the second resist material 134 within and extending from the opening extensions 132 and a ring within and extending from the opening extension 132' (FIG. 16).

Figure 17:
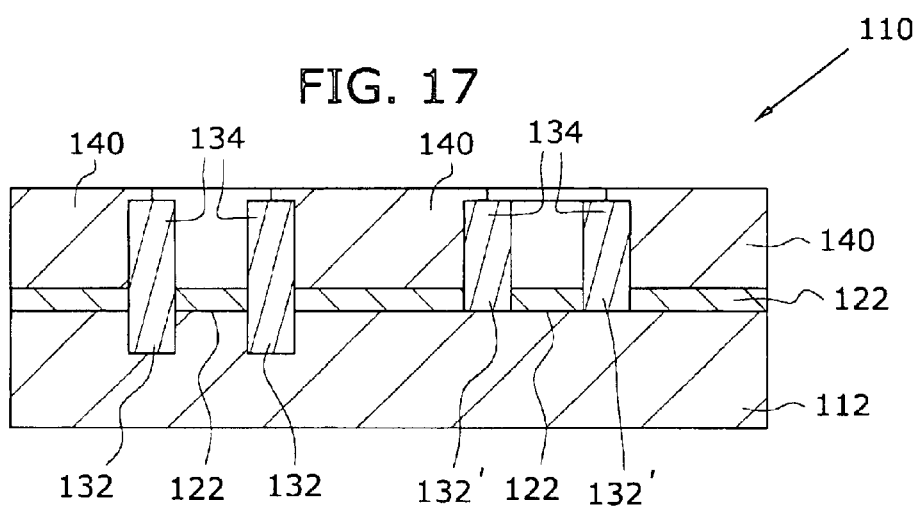
Figure 18:
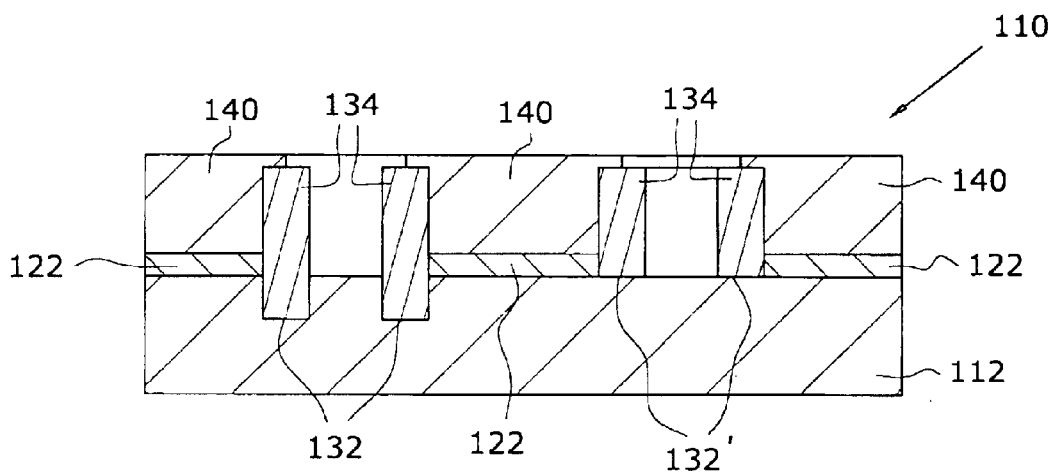
Figure 19:
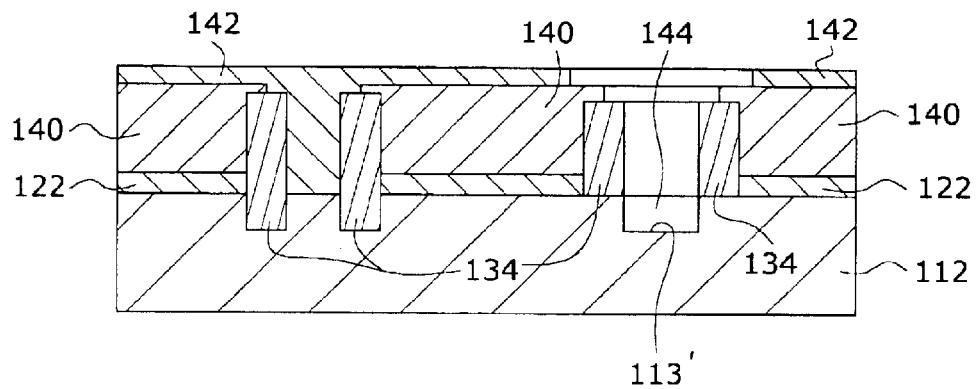

A third resist material 140 is then deposited over the opaque layer 122 and the second resist material 134. The third resist material 140 is subjected to a lithography step (FIG. 17). The openings may be larger than necessary, since overlay misalignment is not an issue. After the addition of the third resist material 140, portions of the opaque layer 122 which are bounded by the second resist material 134 are removed (FIG. 18).

Figure 20:
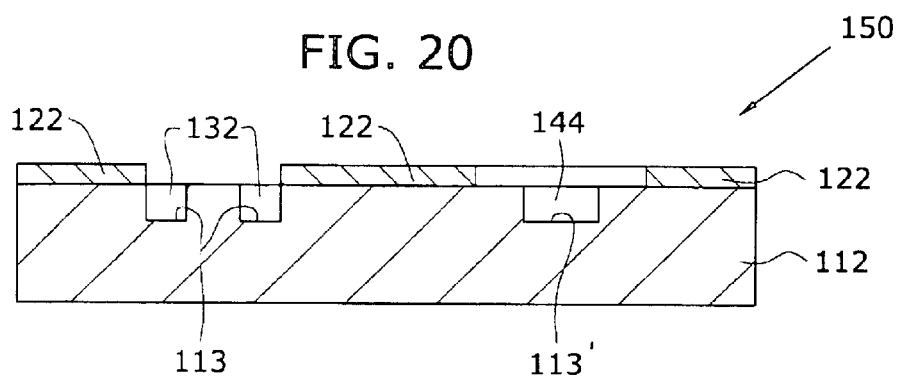
FIG. 20 is a cross-sectional view of a mask constructed in accordance with the process steps of FIGS. 12–19.

A fourth resist material 142 is then added and patterned through another lithography step to leave an opening bounded by the ring of the second resist material 134. Again, the openings may be larger than necessary, since overlay misalignment is not an issue. The portion of the substrate 112 underlying the opening bounded by the ring of the second resist material 134 is etched leaving an opening 144 within the substrate 112 (FIG. 19), the base of which is a printable contact area 113'. Finally, as shown in FIG. 20, the resist materials 134, 140, 142 are all removed, leaving the mask 150, and opening up printable line areas 113 and the printable contact area 113'.

The resulting mask 150 includes printable line areas 113 with a phase shifter area between the areas 113. The mask 150 further includes a printable contact area 113' within a surround phase shifter area.

Figure 21:
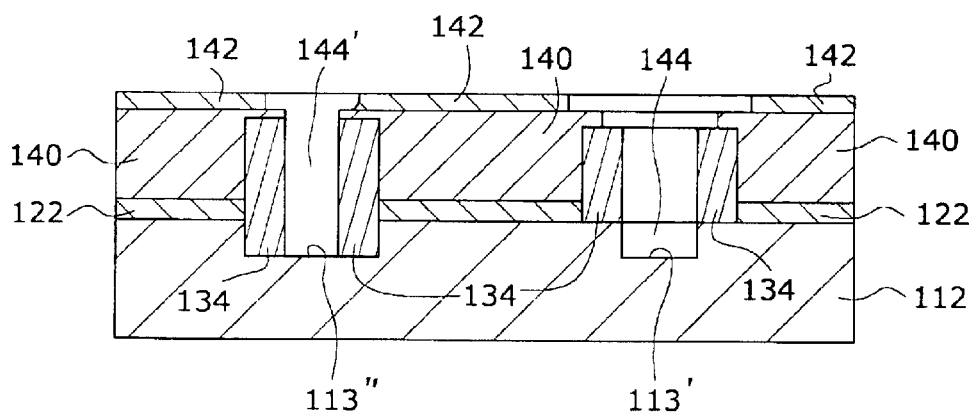
FIGS. 21–22 are cross-sectional views, like FIG. 10, showing alternative subsequent processing steps to a mask-in-process in accordance with another embodiment of the invention.
Figure 22:
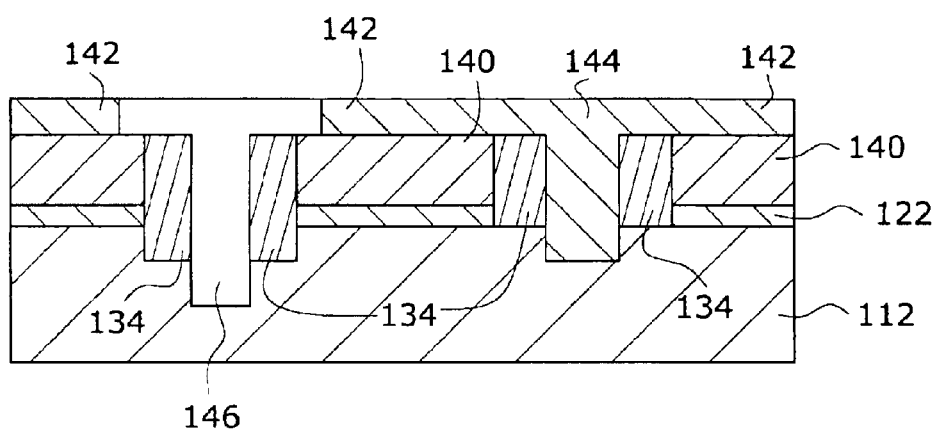
Figure 23:
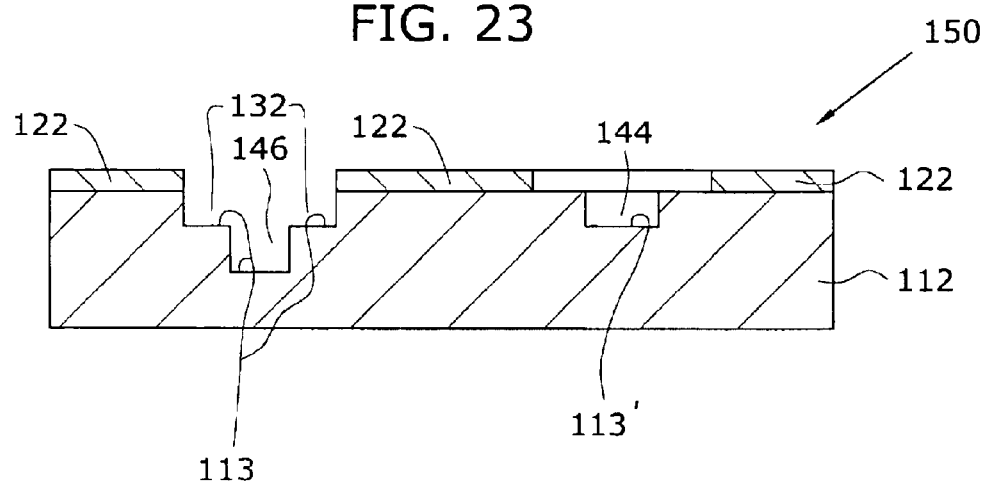
FIG. 23 is a cross-sectional view of a mask constructed in accordance with the process steps of FIGS. 12–18 and 21–22.

With reference to FIGS. 21–23, an alternative set of processing steps are described. After processing a mask-in-process 110 as shown in FIGS. 12–18, the portions of the substrate 112 underlying the openings bounded by the second resist material 134 are etched leaving openings 144 and 144', the bases of which are, respectively, printable contact areas 113' and 113". The fourth resist material 142 is then added and patterned through another lithography step to leave an opening bounded by the ring of the second resist material 134. Again, the openings may be larger than necessary, since overlay misalignment is not an issue. An etching process is then performed on the opening 144', creating an opening 146 which is deeper than and bounded by the openings 132 (FIGS. 15, 23). Finally, as shown in FIG. 23, the resist materials 134, 140, 142 are all removed, leaving the mask 150, and opening up printable line areas 113 and the printable contact area 113'.

While the foregoing has described in detail preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of forming a mask, comprising:

forming a first layer of material over a substrate;

forming an opaque layer overlying said first layer of material, said opaque layer having at least one opening therein filled with a first resist material, said first resist material residing over said first layer of material and defining areas of said first layer of material which are to be removed;

using said first resist material as a mask to remove said areas of said first layer of material; and removing said first resist material.

2. The method of claim 1, wherein the using of said first resist material as a mask comprises providing a first region from which said first layer of material is removed, and the removing of said first resist material comprises providing a second region from which said first resist material is removed, said first and second regions having different phase shift characteristics with respect to light transmitted therethrough.

3. The method of claim 2, wherein said first region provides a phase shift with respect to light transmitted therethrough of 180 degrees and said second region provides a phase shift with respect to light transmitted therethrough of zero degrees.

4. The method of claim 2, wherein said first region provides a phase shift with respect to light transmitted therethrough of zero degrees and said second region provides a phase shift with respect to light transmitted therethrough of 180 degrees.

5. The method of claim 2, wherein said first and second regions form a rim type phase-shifter.

6. The method of claim 2, wherein said at least one opening comprises a plurality of openings.

7. The method of claim 6, wherein said first and second regions form a Levenson-type phase-shifter.

8. The method of claim 1, wherein the forming of said opaque layer comprises:
depositing a second resist material on said opaque layer;
removing a portion of said second resist material, leaving said opening;
etching an uncovered portion of said opaque layer underlying the removed portion of said second resist material, thereby deepening said opening; and
removing the remainder of said second resist material.

9. The method of claim 8, wherein the using of said first resist as a mask comprises:
providing said first resist material within said opening and over said opaque layer;
directing a first exposure through said substrate to expose a portion of said first resist material;
hardening the exposed portion of said first resist material;
directing a second exposure at said first resist material to remove any unhardened portions of said first resist material;
providing a second material over said opaque layer and said hardened portion of said first resist material;
performing a lithographic step on a portion of said second material overlying and bounded by said first resist material to expose and remove said portion of said second material; and
etching said first layer of material underlying said exposed and removed portion of said second material.

10. The method of claim 9, wherein said first resist material is a positive-tone resist material capable of making an image reverse tone.

11. The method of claim 9, wherein the exposed portion of said first resist material is hardened by baking.

12. The method of claim 1, wherein said first layer of material comprises a material adapted to allow a 180 degree phase shift with respect to open areas of said substrate.

13. The method of claim 12, wherein said first layer of material comprises one or more from the group consisting of molybdenum-suicide, chromium-fluoride, silicon nitride-titanium nitride, tantalum silicide, and zirconium silicon oxide.

14. The method of claim 13, wherein said first layer of material comprises molybdenum-silicide.

15. The method of claim 13, wherein said first layer of material comprises chromium fluoride.

16. The method of claim 1, wherein said substrate comprises a material transparent to ultraviolet light.

17. The method of claim 16, wherein said substrate comprises quartz.

18. The method of claim 1, wherein said opaque layer comprises chromium.

19. A method of forming a mask, comprising:
forming an opaque layer over a substrate, said opaque layer having at least one opening therein filled with a first material, said first material defining areas of said substrate which are to be removed, said forming comprising:
depositing a first resist material on said opaque layer;
removing a portion of said first resist material, leaving said opening;
etching an uncovered portion of said opaque layer underlying the removed portion of said first resist material, thereby deepening said opening a first time; and
removing the remainder of said first resist material;
etching the substrate defined by said deepened opening, thereby deepening said opening a second time;
using said first material as a mask to remove said areas of said substrate, wherein the using of said first material as a mask comprises:
providing said first material within said twice deepened opening and over said opaque layer;
directing a first exposure through said substrate to expose a portion of said first material;
hardening the exposed portion of said first material;
directing a second exposure at said first material to remove any unhardened portions of said first material;
providing a second material over said opaque layer and said hardened portion of said first material;
performing a lithographic step on a portion of said second material overlying and bounded by said first material to expose and remove said portion of said second material; and
etching said opaque layer underlying said exposed and removed portion of said second material; and
removing said first material.

20. The method of claim 19, wherein the exposed portion of said first material is hardened by baking.

21. The method of claim 19, wherein said first material is a positive-tone resist material capable of making an image reverse tone.

22. The method of claim 19, wherein the using of said first material as a mask comprises:
providing said first material within said deepened opening and over said opaque layer;
directing a first exposure through said substrate to expose a portion of said first material;
baking said first material to harden the exposed portion of said first material;
directing a second exposure at said first material to remove any unhardened portions of said first material;
providing a second material over said opaque layer and said hardened portion of said first material;
performing a lithographic step on a portion of said second material overlying and bounded by said first material to expose and remove said portion of said second material; and
etching said opaque layer underlying said exposed and removed portion of said second material.

23. The method of claim 22, further comprising etching said substrate underlying said etched opaque layer and removing the remainder of said first and second materials.

24. The method of claim 22, wherein said first material is a positive-tone resist capable of making an image reverse tone.

25. The method of claim 19, wherein the using of said first material as a mask comprises providing at least one first region from which said opaque material is removed, and the removing of said first material comprises providing at least one second region from which said first material is removed, said first and second regions having different phase shift characteristics with respect to light transmitted therethrough.

26. The method of claim 25, wherein said first region provides a phase shift with respect to light transmitted therethrough of 180 degrees and said second region provides a phase shift with respect to light transmitted therethrough of zero degrees.

27. The method of claim 25, wherein said first region provides a phase shift with respect to light transmitted therethrough of zero degrees and said second region provides a phase shift with respect to light transmitted therethrough of 180 degrees.

28. The method of claim 25, wherein said first and second regions form a rim type phase-shifter.

29. The method of claim 25, wherein said at least one first region comprises a plurality of first regions and wherein said at least one second region comprises a plurality of second regions.

30. The method of claim 29, wherein said at least one of said first and second regions form a rim type phase-shifter.

31. The method of claim 30, wherein said at least one of said first and second regions form a Levenson-type phase-shifter.

* * * * *